United States Patent [19]

Topp et al.

[11] Patent Number: 5,424,892
[45] Date of Patent: Jun. 13, 1995

[54] CIRCUIT FOR PROTECTING A MOSFET POWER TRANSISTOR

[75] Inventors: Rainer Topp, Reutlingen; Roland Schmid, Moessingen; Dagmar Oertel, Stuttgart, all of Germany

[73] Assignee: Robert Bosch GmbH, Stuttgart, Germany

[21] Appl. No.: 256,485

[22] PCT Filed: Oct. 28, 1993

[86] PCT No.: PCT/DE93/01029
§ 371 Date: Jul. 6, 1994
§ 102(e) Date: Jul. 6, 1994

[87] PCT Pub. No.: WO94/11947
PCT Pub. Date: May 26, 1994

[30] Foreign Application Priority Data

Nov. 6, 1992 [DE] Germany .................... 42 37 489.8

[51] Int. Cl.⁶ .................................. H02H 9/02
[52] U.S. Cl. ............................ 361/18; 361/58; 323/908
[58] Field of Search ............... 361/18, 58, 86, 87; 323/908

[56] References Cited

U.S. PATENT DOCUMENTS 5,179,488  1/1993  Rovner .................... 361/58
5,283,707  2/1994  Conners ................... 361/58

FOREIGN PATENT DOCUMENTS

0442561A1  8/1991  European Pat. Off. .

OTHER PUBLICATIONS

P. Brauschke et al., "TEMPFET—One Step Closer to an Ideal Power Semiconductor Switch", *Siemens Components*, vol. 24, No. 6, Dec. 1989, pp. 228–232.
H. C. Chang et al., "Integrated Delay Circuit/Noise Rejection Circuit", *IBM Technical Disclosure Bulletin*, vol. 16, No. 1, Jun. 1973, pp. 317–318.

*Primary Examiner*—Todd Deboer
*Attorney, Agent, or Firm*—Kenyon & Kenyon

[57] ABSTRACT

A circuit for protecting a MOSFET power transistor, the circuit having a variable input impedance in which the rate of rise of voltage is to be increased and thus the switching time reduced. For this purpose, a second MOSFET auxiliary transistor is connected by its bulk electrode to the source of the MOSFET power transistor. The source of the second MOSFET auxiliary transistor is connected to the gate of a third MOSFET auxiliary transistor and to the gate of the MOSFET power transistor. The drain of the second MOSFET auxiliary transistor is connected to a circuit input terminal which is coupled by a resistor to the gate of the MOSFET power transistor. The gate of the second MOSFET auxiliary transistor is connected to the drain of the second MOSFET auxiliary transistor as well as to the source of the third MOSFET auxiliary transistor. The drain of the third MOSFET auxiliary transistor is connected to the gate of the MOSFET power transistor, and the bulk electrode of the third MOSFET auxiliary transistor is connected to the source electrode of the MOSFET power transistor.

9 Claims, 2 Drawing Sheets

CIRCUIT FOR PROTECTING A MOSFET POWER TRANSISTOR

FIELD OF THE INVENTION

The present invention relates to a circuit for protecting a MOSFET power transistor of variable input impedance.

1. Background of the Invention

Protecting circuits for MOSFET power transistors, especially for protecting these transistors against short circuiting, are already known. To decouple the protecting circuit from the driver circuit, a gate series resistor is necessary. However, if short switching times are to be achieved, it is disadvantageous that the gate series resistor must be of low resistance, i.e., the input current becomes very large. If the static input current is to be reduced in the event of a fault, this can be achieved only using a resistor of high resistance.

2. Summary of the Invention

An object of the present invention is to specify a protecting circuit for MOSFET power transistors which increases the rate of rise of voltage by means of variable input impedance of the drive circuit, i.e., the delay time and thus the switching time are markedly reduced.

As a result of the circuit of the present invention, it is possible in an advantageous manner to reduce the switching power loss and, at the same time, to achieve the maximum possible switching frequency. Furthermore, equivalent switching conditions are achieved with less stringent requirements imposed upon the driver circuit.

DETAILED DESCRIPTION

Figure 1:
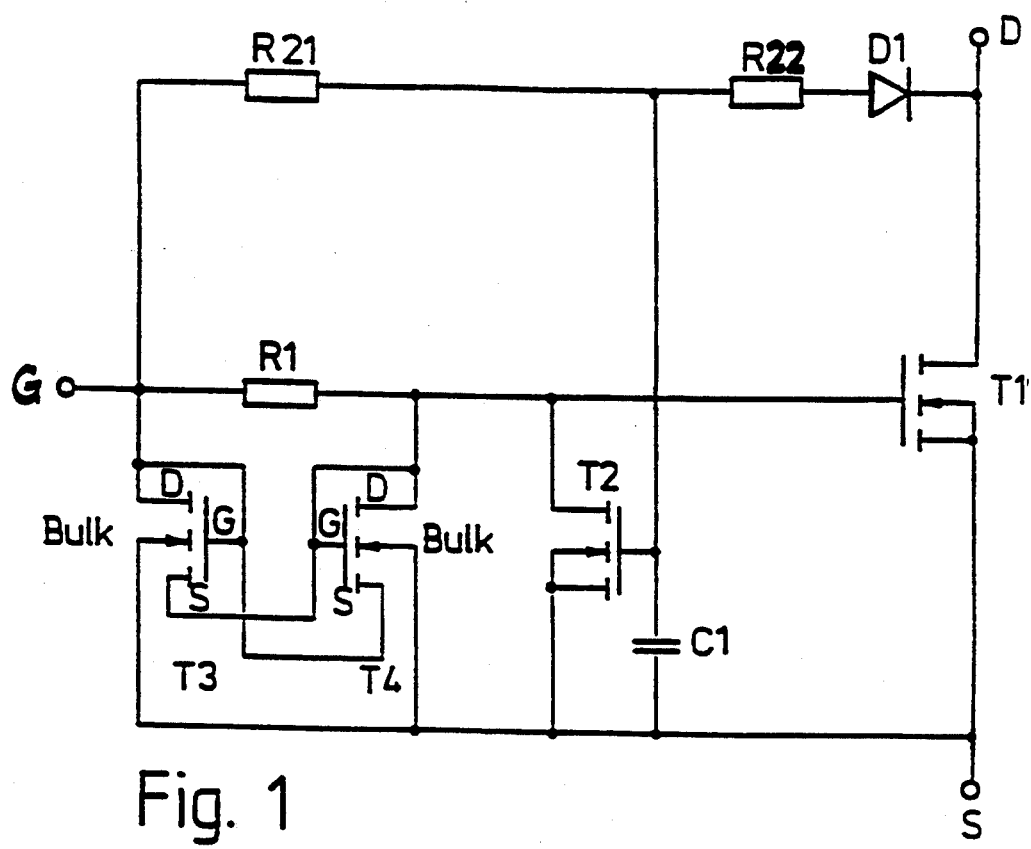
FIG. 1 shows a MOSFET power transistor with a first embodiment of a protecting circuit in accordance with the present invention.

In the block diagram shown in FIG. 1, T1 designates a MOSFET power transistor comprising a plurality of transistors connected in parallel with one another, S designates its source connecting terminal and D designates its drain connecting terminal. The input terminal G of the MOSFET power transistor T1 is connected via a first ohmic resistor R1 to its polysilicon gate.

A first MOSFET auxiliary transister T2 is connected by its source electrode to the source electrode of the MOSFET power transistor T1. The drain electrode of the MOSFET auxiliary transistor T2 is connected to the polysilicon gate of the MOSFET power transistor T1. The polysilicon gate of the MOSFET auxiliary transistor T2 is connected, on the one hand, via a second ohmic resistor R21 to the input terminal G and, on the other hand, via the series circuit of a third ohmic resistor R22 and a protecting diode D1 to the drain connecting terminal D of the MOSFET power transistor T1. Furthermore, the polysilicon gate of the MOSFET auxiliary transistor T2 is connected to one of the plates of a capacitor C1, the other plate of which is connected to the source electrode of the MOSFET auxiliary transistor T2.

A second MOSFET auxiliary transistor T3, which is connected as a diode, is connected by its bulk electrode to the source electrode of the MOSFET power transistor T1. The source electrode of the MOSFET auxiliary transistor T3 is connected to the gate electrode of a third MOSFET auxiliary transistor T4 and to the polysilicon gate of the MOSFET power transistor T1. The drain electrode of the MOSFET auxiliary transistor T3 is connected to the input terminal G of the MOSFET power transistor T1. The gate electrode of the second MOSFET auxiliary transistor T3 is connected, on the one hand, to the drain electrode of the MOSFET auxiliary transistor T3 and, on the other hand, to the source electrode of a third MOSFET auxiliary transistor T4. The drain electrode of the MOSFET auxiliary transistor T4 is connected to the polysilicon gate of the MOSFET power transistor T1. The bulk electrode of the MOSFET auxiliary transistor T4 is connected to the source electrode of the MOSFET power transistor T1.

The mode of operation of the circuit arrangement according to FIG. 1 is as follows:

In the de-energized condition, the voltage $U_{GS} = 0$ V is applied between gate G and source S. The operating voltage is applied between drain D and source S. Since the diode D1 is biased in the blocking direction, the gate of the auxiliary transistor T2 and the capacitor C1 are discharged. Thus, the gate-source voltages of the auxiliary transistors T2, T3 and T4 are likewise $U_{GS2} = U_{GS3} = U_{GS4} = 0$ V.

When the arrangement is energized, i.e., UGS is increased to typically +5 V, then the input capacitance of the power transistor T1 is charged via the resistor R1 and the gate-source voltage $U_{GS1}$ of the power transistor T1 rises. If the voltage drop $U_{R1}$ across the resistor R1 exceeds the threshold voltage of the auxiliary transistor T3, then the latter becomes conductive, i.e., at the start of the energizing phase, the effective input resistance corresponds to the parallel circuit of the resistor R1 and of the auxiliary transistor T3. With increasing gate-source voltage $U_{GS1}$ of the power transistor T1, the voltage drop $U_{R1}$ across the resistor R1 decreases. If the voltage $U_{R1}$ falls below the threshold voltage of the auxiliary transistor T3, then the latter passes over into the blocking condition, and the effective input resistance is now the resistance R1.

In the energized condition, the voltage UGS and $U_{GS1}$ are equal, i.e., there is no voltage drop across the resistor R1, and the auxiliary transistors T3 and T4 are inactive.

If the arrangement is de-energized by means of $U_{GS} = 0$ V, then the input capacitance of the power transistor T1 is discharged via the resistor R1. As long as the voltage drop across R1 is greater than the threshold voltage of the auxiliary transistor T4, the auxiliary transistor T4 is energized, and the effective input resistance is reduced.

When the protecting circuit is activated, i.e., the auxiliary transistor T2 is energized, then the input capacitance of the power transistor T1 is discharged via the auxiliary transistor T2. This condition is stable only if the gate-source voltage UGS is at least as large as the threshold voltage of the auxiliary transistor T2 and, moreover, the gate-source voltage UGS1 of the power transistor T1 is smaller than the threshold voltage of T1.

When the auxiliary transistor T2 is energized, i.e., the protecting circuit is activated, then a steady input current IG=(UGS-UGS1)/R1 flows.

Figure 2:
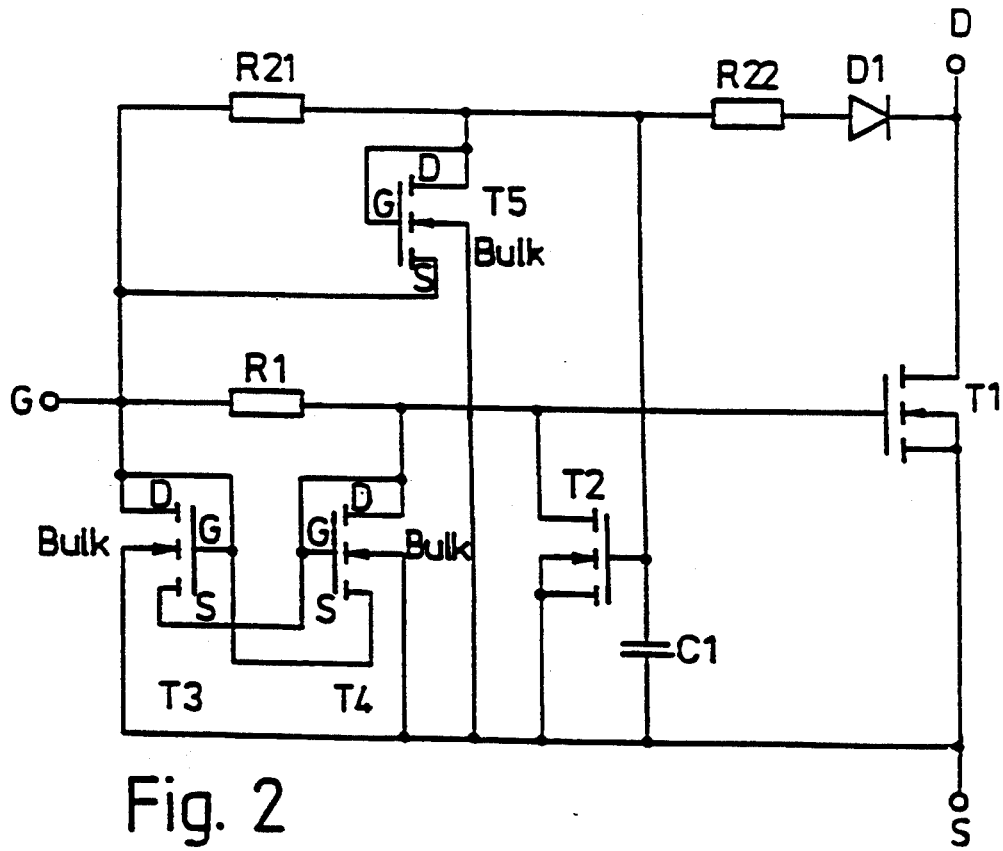
FIG. 2 shows a MOSFET power transistor with a second embodiment of a protecting circuit in accordance with the present invention.

If the charging process and the discharging process of the capacitor C1 are to be decoupled, then according to FIG. 2, a fourth MOSFET auxiliary transistor T5 is provided.

The drain electrode of the MOSFET auxiliary transistor T5 is connected, on the one hand, via the ohmic resistor R21 to the input terminal G and, on the other hand, via the series circuit of the ohmic resistor R22 and the protecting diode D1 to the drain connecting terminal D of the MOSFET power transistor T1. Furthermore, the drain electrode of the MOSFET auxiliary transistor T5 is connected to its gate electrode. The source electrode of the MOSFET auxiliary transistor T5 is connected to the input terminal G of the MOSFET power transistor T1. The bulk electrode of the MOSFET auxiliary transistor T5 is connected to the source connecting terminal S of the MOSFET power transistor.

In this arrangement, the process of charging the capacitor C1 takes place, upon energization of the power transistor T1, via the resistor R21. Upon de-energization of the power transistor T1, the process of discharging the capacitor C1 is accelerated, as long as the voltage drop across the resistor R21 is greater than the threshold voltage of the auxiliary transistor T5.

Thus, it is possible to expand the permissible pulse-duty-factor range.

Depending upon the desired switching performance, the MOSFET auxiliary transistors T3, T4 and T5 can be used individually or in combination.

Figure 3:
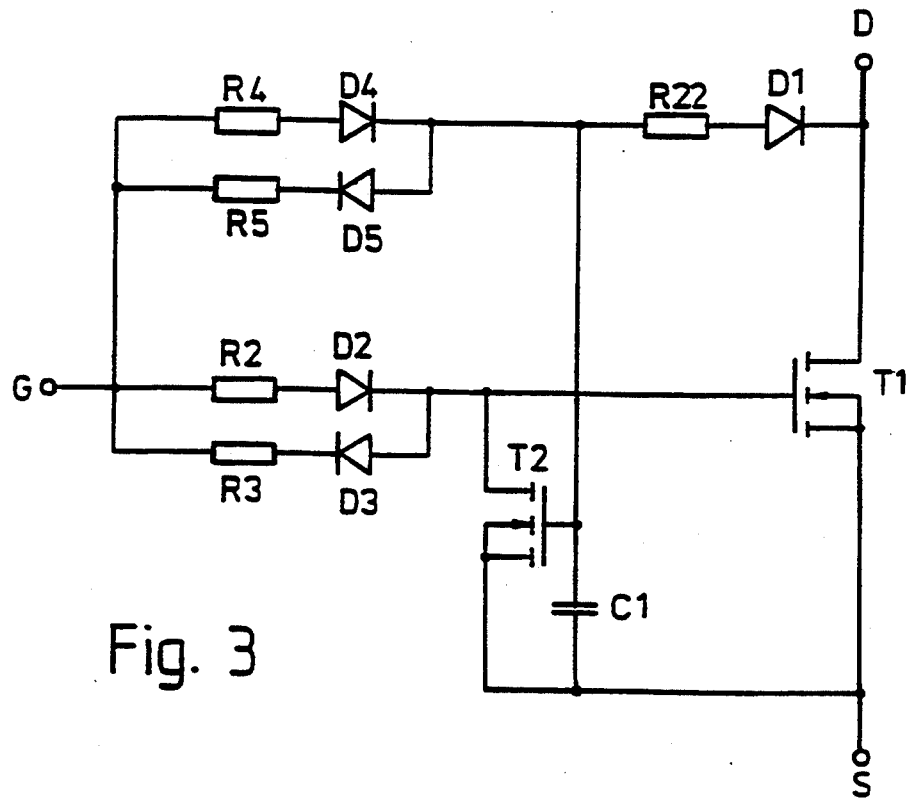
FIG. 3 shows a MOSFET power transistor with a third embodiment of a protecting circuit in accordance with the present invention.

Since the MOSFET auxiliary transistors T3, T4 and T5 exhibit the same function as a series circuit consisting of an ohmic resistor and a diode, the protecting circuit can also be constructed in accordance with FIG. 3. In this case, a parallel circuit of the series circuits of the ohmic resistor R2 and, the diode D2 and respectively of the ohmic resistor R3 and the diode D3 is provided between the polysilicon gate of the MOSFET power transistor T1 and the input terminal G. In this case, the diode D2 is connected in the conducting direction and the diode D3 in the blocking direction.

A further parallel circuit of the series circuits of the ohmic resistor R4 and the diode D4 and respectively of the ohmic resistor R5 and the diode D5 is disposed between the input terminal G and the series circuit of the ohmic resistor R22 and the diode D1. The diode D4 is connected in the conducting direction and the diode D5 in the inhibiting direction.

The series circuits of the resistor/diode combinations R2/D2, R3/D3, R4/D4, and R5/D5 can optionally be provided as complete or, however, also as partial circuits.

The explanations set forth in the example related to a protecting circuit in the event of a short circuit.

Figure 4:
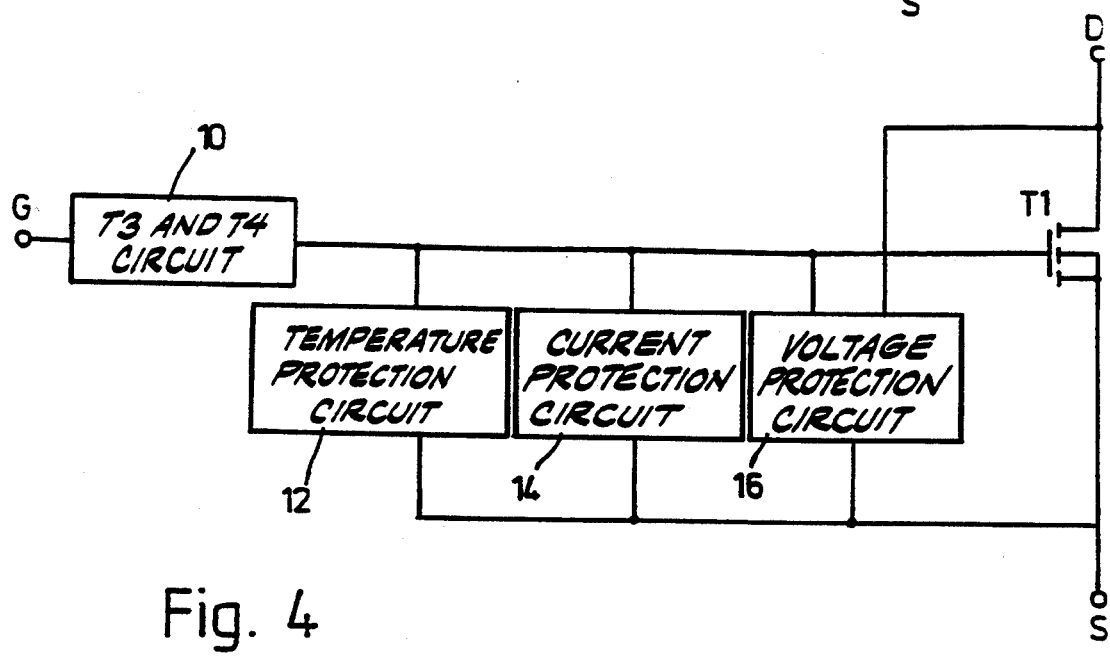
FIG. 4 is a block diagram showing the combination of several protecting circuits in accordance with the present invention.

As shown in the block diagram in FIG. 4, the dynamic reduction of the input impedance with the aid of the MOSFET auxiliary transistors T3 and T4 (here indicated by 10) can also be used in conjunction with other protecting circuits for the MOSFET power transistor T1. Thus, by way of example, an excess temperature protecting circuit 12, an excess current protecting circuit 14, an excess voltage protecting circuit 16, or a combination of these can be constructed.

The present invention is not restricted to the indicated example. Thus, in particular, a sense FET power transistor can be used in place of a normal POWER MOSFET power transistor.

Over and above this, the arrangements can be used both for low side switches and high side switches.

The entire circuit arrangement is monolithically integrated in a wafer-shaped, monocrystalline semiconductor body, which exhibits a first and a second main surface, is made of silicon, and which has the various circuit elements and protecting elements respectively diffused into it.

What is claimed is:

1. A circuit for protecting a MOSFET power transistor, the circuit comprising:
    a source terminal coupled to a source of the MOSFET power transistor;
    a drain terminal coupled to a drain of the MOSFET power transistor;
    an input terminal coupled via a first resistor to a gate of the MOSFET power transistor;
    a first auxiliary transistor having a source coupled to the source of the MOSFET power transistor, a drain coupled to the gate of the MOSFET power transistor, and a gate coupled via a second resistor to the input terminal, via a series combination of a third resistor and a first diode to the drain of the MOSFET power transistor, and via a capacitor to the source of the MOSFET power transistor;
    a second auxiliary transistor having a bulk electrode coupled to the source of the MOSFET power transistor, a source coupled to the gate of the MOSFET power transistor, a drain coupled to the input terminal, and a gate coupled to the drain of the second auxiliary transistor;
    a third auxiliary transistor having a gate coupled to the source of the second auxiliary transistor, a source coupled to the gate of the second auxiliary transistor, a drain coupled to the gate of the MOSFET power transistor, and a bulk electrode coupled to the source of the MOSFET power transistor.

2. The circuit according to claim 1, further comprising a fourth auxiliary transistor having a source coupled to the input terminal, a bulk electrode coupled to the source of the MOSFET power transistor, and a drain and a gate coupled via the second resistor to the input terminal and, via the series combination of the third resistor and the first diode, to the drain of the MOSFET power transistor.

3. The circuit according to claim 2, wherein the second, third, and fourth auxiliary transistors are disposed in freely-selectable, arbitrary combinations.

4. The circuit according to claim 1, wherein a first parallel circuit is disposed between the gate of the MOSFET power transistor and the input terminal, the first parallel circuit including a first series combination of a fourth resistor and a second diode, the first series combination being in parallel with a second series combination of a fifth resistor and a third diode.

5. The circuit according to claim 1, wherein a second parallel circuit is disposed between the input terminal and the series combination of the third resistor and the first diode, the second parallel circuit including a third series combination of a sixth resistor and a fourth diode, the third series combination being in parallel with a fourth series combination of a seventh resistor and a fifth diode.

6. The circuit according to claim 4, wherein a second parallel circuit is disposed between the input terminal and the series combination of the third resistor and the first diode, the second parallel circuit including a third series combination of a sixth resistor and a fourth diode, the third series combination being in parallel with a fourth series combination of a seventh resistor and a fifth diode.

7. The circuit according to claim 1, wherein the circuit performs a protection function selected from the group of protection functions consisting of short-circuit protection, excess temperature protection, excess current protection, and excess voltage protection.

8. The circuit according to claim 2, wherein the second, third, and fourth auxiliary transistors are MOSFET transistors.

9. The circuit according to claim 1, wherein the entire circuit arrangement is monolithically integrated in a wafer-shaped, monocrystalline semiconductor body which exhibits a first and a second main surface and is made of silicon, and which has the various circuit elements and protecting elements respectively diffused into it.

* * * * *